United States Patent
Goins, III

[11] Patent Number: 6,014,993
[45] Date of Patent: Jan. 18, 2000

[54] METHOD AND APPARATUS FOR CONFIGURING COMPONENT LEADS

[75] Inventor: Fred A. Goins, III, Boise, Id.

[73] Assignee: MCMS, Inc., Nampa, Id.

[21] Appl. No.: 09/049,763

[22] Filed: Mar. 27, 1998

[51] Int. Cl.$^7$ .................................................. B21F 45/00
[52] U.S. Cl. .................................................. 140/105
[58] Field of Search .................................... 140/105, 147

[56] References Cited

U.S. PATENT DOCUMENTS

| | | | |
|---|---|---|---|
| 3,515,175 | 6/1970 | Hudson | 140/105 |
| 4,103,718 | 8/1978 | Steigerwald | 140/105 |
| 4,481,984 | 11/1984 | Linker . | |
| 4,665,954 | 5/1987 | Linker et al. . | |
| 4,787,426 | 11/1988 | Linker et al. . | |
| 5,219,404 | 6/1993 | Moore et al. . | |
| 5,273,081 | 12/1993 | Maksim . | |
| 5,283,946 | 2/1994 | Simmons et al. | 140/105 |
| 5,301,720 | 4/1994 | Plummer, Jr. et al. . | |
| 5,319,847 | 6/1994 | Darling et al. . | |
| 5,431,197 | 7/1995 | Linker, Sr. et al. . | |
| 5,467,803 | 11/1995 | Yoshimura et al. | 140/105 |
| 5,477,894 | 12/1995 | Wakabayashi et al. | 140/147 |
| 5,487,416 | 1/1996 | Maksim . | |
| 5,542,457 | 8/1996 | Gordon et al. . | |

Primary Examiner—Lowell A. Larson
Attorney, Agent, or Firm—Knobbe, Martens Olson & Bear, LLP

[57] ABSTRACT

A method and apparatus for bending a plurality of leads of a component, in order to straighten and/or repair damaged or misaligned leads, is disclosed. The apparatus includes: a securing structure for receiving and holding the component; a first member for engaging the plurality of leads of the component; and a second member for engaging the plurality of leads of the component, wherein the first and second dowels cooperate with one another so as to form the plurality of leads into a desired configuration. The method includes: securing the component to a platform such that the component remains stable during a lead bending process; positioning a first member under the plurality of leads at a first bottom position; positioning a second member above the plurality of leads at a first top position; moving the second member so as to engage a top surface of each lead, thereby exerting a downward force on the plurality of leads, wherein the plurality of leads are caused to bend around the first member located at the first bottom position; moving a plurality of alignment members between spaces between adjacent leads of the plurality of leads so as to align the adjacent leads in a desired orientation with respect to each other; and moving the first member so as to engage a bottom surface of each lead, thereby exerting an upward force on the plurality of leads and forcing the plurality of leads to bend around the second member located at a second top position.

44 Claims, 6 Drawing Sheets

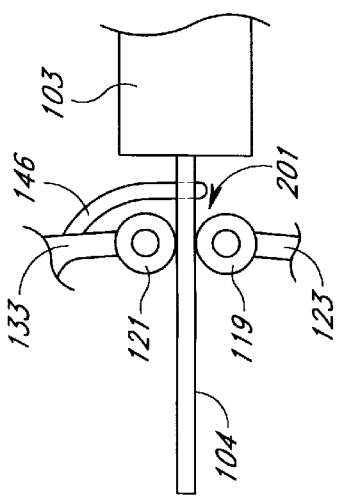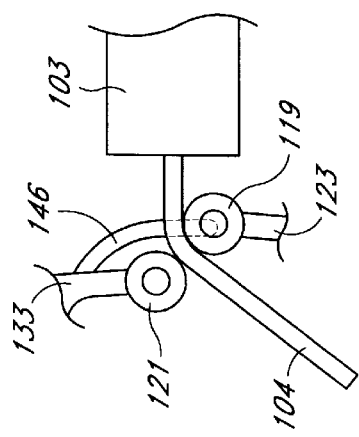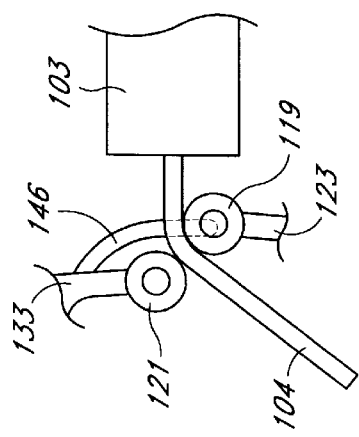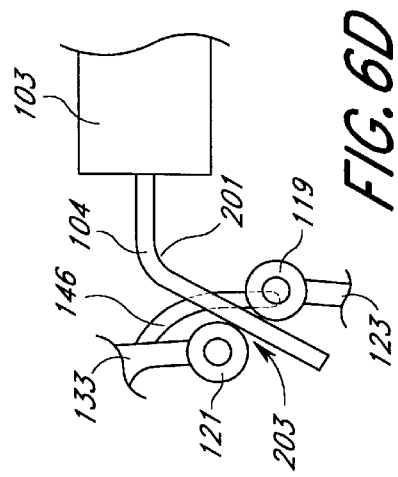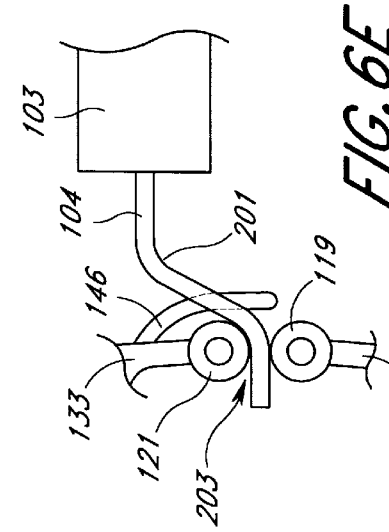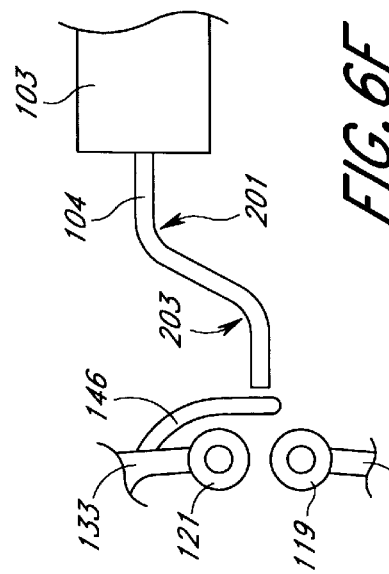

METHOD AND APPARATUS FOR CONFIGURING COMPONENT LEADS

BACKGROUND OF THE INVENTION

1. Field of the Invention

The invention relates to configuring the leads of integrated circuit (IC) chips which are used in conjunction with printed circuit boards (PCBs). More particularly, the invention relates to a method and apparatus for bending and/or straightening the leads of fine pitch components which have been damaged.

2. Description of the Related Technology

In the surface mount board manufacturing industry, high speed automated placement machines are used to place surface mount components onto bare PCBs. To accomplish this process, parts are first received from a manufacturer in one of several mediums, including 1) loose parts in a tube; 2) parts in a tape and reel; and 3) parts trays. These parts are extracted from their packaging mediums and then loaded into a placement machine which automatically places them onto the PCB. Prior to placement, the leads of each part are inspected by a machine vision system of the placement machine.

Typical machine vision systems have a back-lighting system, which shines light on a component or part, and a camera which views the illuminated component from a bottom perspective of the component. The light and the component produce a grey-scale image as a result of the shadows produced by the component. This grey-scale image is translated into black or white pixels within the camera. If a lead of the component, is bent or damaged, improper pixels will either be black or white which is detected by the machine vision system. The configuration of black and white pixels produced by an undamaged component is stored within a memory of the machine vision system. The pixel configuration produced by a component being inspected is compared to this "true" pixel configuration and if a mismatch occurs, the component is designated as not passing the visual inspection and is rejected by the automatic placement machine. Of course, machine errors can also cause a component to be rejected. Such automated placement machines, as well as their vision systems, are well-known in the art.

If a part passes the inspection, placement coordinates are calculated, and the part is then placed onto the PCB. If a part is rejected, it is typically taken out of the machine manually and placed into a medium with other damaged parts. During their loading and unloading from the automatic placement machine, parts can be easily damaged. This is particularly true of fine pitch components whose leads are extremely thin and frail, sometimes being less than 20 mils thick. The machine vision system will not allow the machine to place these damaged parts.

Referring to FIG. 1, a typical fine pitch integrated circuit (IC) 11 is shown. The IC 11 includes multiple fine pitch leads 13 extending outwardly from each side surface 15 of the IC body 17. As the industry is moving toward the integration of more and more components into an IC package, it is moving toward finer pitch packages having pin counts of 100 or more. With the trend toward larger pin count packages, lead pitches have decreased in order to preserve real estate efficiency on a printed circuit board (PCB). With the increase in usage of application specific integrated circuit (ASIC) devices, for example, finer pitch devices have become very common.

As mentioned above, one inherent disadvantage of using fine pitch components is the increased delicacy with which these components must be handled. Because they are so fragile, the leads of these components are easily bent or otherwise damaged during the assembly process.

Prior art methods for repairing damaged fine pitch leads typically involve a human operator who manually attempts to bend the leads back into proper alignment using tweezers or some other tool. This process is tedious, time-consuming and inaccurate. Often, if a large number of fine pitch leads have been damaged, the component is discarded or destroyed. The destruction of these fine pitch parts can be very costly to the manufacturer, since fine pitch components may be worth hundreds or even thousands of dollars each. When high numbers of components are damaged through shipping, manufacturing, or mishandling, a sizable amount of profit can be destroyed. Therefore, a fast and accurate method and apparatus for configuring and/or repairing the leads of damaged fine pitch components is needed.

SUMMARY OF THE INVENTION

The invention addresses the above and other needs by providing an apparatus and method for repairing and/or bending the damaged leads of a component, such as an integrated circuit (IC). In particular, the invention provides an automated method and apparatus for configuring the leads of a component and reforming the damaged leads of a component. By repairing the damaged leads of the component, not only is the cost of the component saved, but also the amount of time lost while waiting for delivery of new parts is eliminated.

In one embodiment of the invention, an apparatus for configuring a plurality of leads of a component, includes: a securing structure which receives and holds the component; a first member which engages the plurality of leads of the component; and a second member which engages the plurality of leads of the component, wherein the first and second members cooperate so as to form the plurality of leads into a desired shape.

In another embodiment, a system for configuring a plurality of leads of a component, includes: a securing structure which receives and holds the component; a first arm; a first member, coupled to the first arm, for engaging the plurality of leads of the component; a first vertical motor, coupled to the first arm, for moving the first arm vertically, in a y-direction; a first horizontal motor, coupled to the first vertical motor, for moving the vertical motor and the first arm horizontally, in a x-direction, wherein the first horizontal and vertical motors cooperate so as to provide angular movement to the first arm; a second arm; a second member, coupled to the second arm, for engaging the plurality of leads of the component; a second vertical motor, coupled to the second arm, for moving the second arm vertically, in a y-direction; a second horizontal motor, coupled to the second vertical motor, for moving the second vertical motor and the second arm horizontally, in a x-direction, wherein the second vertical and horizontal motors cooperate with one another so as to provide angular movement to the second arm; and a controller, coupled to the first and second vertical motors and the first and second horizontal motors, for controlling the motion of the first and second arms, wherein the first and second members mechanically cooperate to engage the plurality of leads so as to bend and form the leads into a desired configuration.

In a further embodiment, a system for configuring a plurality of leads of a component, includes: means for securing the component so as to prevent the component from moving; means for positioning a first member under the plurality of leads at a first bottom position; means for positioning a second member above the plurality of leads at a first top position; and means for moving the second member so as to engage a top surface of each lead, thereby exerting a downward force on the plurality of leads, wherein the plurality of leads are caused to bend around a portion of the first member located at the first bottom position.

In another embodiment of the invention, a method of configuring a plurality of leads of a component, includes the acts of: securing the component to a platform so as to prevent the component from moving; positioning a first member under the plurality of leads at a first bottom position; positioning a second member above the plurality of leads at a first top position; and moving the second member so as to engage a top surface of each lead, thereby exerting a downward force on the plurality of leads, wherein the plurality of leads are caused to bend around a portion of the first member located at the first bottom position.

In a further embodiment, a method of configuring a plurality of leads of a component, includes: securing the component to a platform so as to prevent the component from moving; positioning a first dowel under the plurality of leads at a first bottom position; positioning a second dowel above the plurality of leads at a first top position; moving the second dowel so as to engage a top surface of each lead, thereby exerting a downward force on the plurality of leads, wherein the plurality of leads are caused to bend around the first dowel located at the first bottom position, and wherein the motion of the second dowel is ceased when the second dowel reaches a second top position; and moving the first dowel so as to engage a bottom surface of each lead, thereby exerting an upward force on the plurality of leads, wherein the plurality of leads are caused to bend around the second dowel located at the second top position.

In a further embodiment, a method of configuring at least one lead of a component, includes: securing the component to a platform so as to prevent the component from moving; positioning a first member under the plurality of leads at a first bottom position; positioning a second member above the plurality of leads at a first top position; moving the second member so as to engage a top surface of each lead, thereby exerting a downward force on the plurality of leads, wherein the plurality of leads are caused to bend around the first member located at the first bottom position; moving the first member so as to engage a bottom surface of each lead, thereby exerting an upward force on the plurality of leads, wherein the plurality of leads are caused to bend around the second member located at a second top position; and moving a plurality of alignment members within corresponding spaces between adjacent leads of the plurality of leads so as to straighten and align the adjacent leads with respect to each other.

In a further embodiment, a method of configuring at least one lead of a component, includes: controlling a first machine to move a first member to engage the at least one lead of the component in a predefined manner; and controlling a second machine to move a second member to engage the at least one lead in a predefined manner, wherein the first and second members cooperate to form the at least one lead in a desired configuration.

In another embodiment, the invention is characterized as a method of configuring a plurality of leads of a component, the method being implemented using a system having first vertical and horizontal motors and second vertical and horizontal motors, and including the acts of: controlling the first vertical motor to move a first member in a vertical direction; controlling the first horizontal motor to move the first member in a horizontal direction, wherein the first vertical and horizontal motors cooperate such that the first member engages the at least one lead of the component in a predefined manner; controlling the second vertical motor to move a second member in a vertical direction; and controlling the second horizontal motor to move the second member in a horizontal direction, wherein the second vertical and horizontal motors cooperate such that the second member engages the at least one lead of the component in a predefined manner, and wherein the first and second members cooperate so as to form the at least one lead into a desired configuration.

In yet a further embodiment, a method of configuring a plurality of leads of a component, includes: controlling a first vertical motor to rotate a first vertical drive screw in a specified direction and at a specified speed; controlling a first horizontal motor to rotate a first horizontal drive screw in a specified direction and at a specified speed, wherein the first vertical and horizontal drive screws cooperate to provide angular motion to a first member such that the first member engages the plurality of leads in a predefined manner; controlling a second vertical motor to rotate a second vertical drive screw in a specified direction and at a specified speed; and controlling a second horizontal motor to rotate a second horizontal drive screw in a specified direction and at a specified speed, wherein the second vertical and horizontal drive screws cooperate to provide angular motion to a second member such that the second member engages the plurality of leads in a predefined manner, and wherein the first and second members cooperate to form the plurality of leads into a desired configuration.

BRIEF DESCRIPTION OF THE DRAWINGS

FIGS. 6A–6F are elevated side views of a pair of dowels engaging leads of a component during various steps of a process of bending the leads of the component using one embodiment of a lead bending apparatus in accordance with the invention.

DETAILED DESCRIPTION OF THE INVENTION

The invention is described in further detail below with reference to the Figures, wherein like elements are referenced by like numerals throughout.

Figure 2:
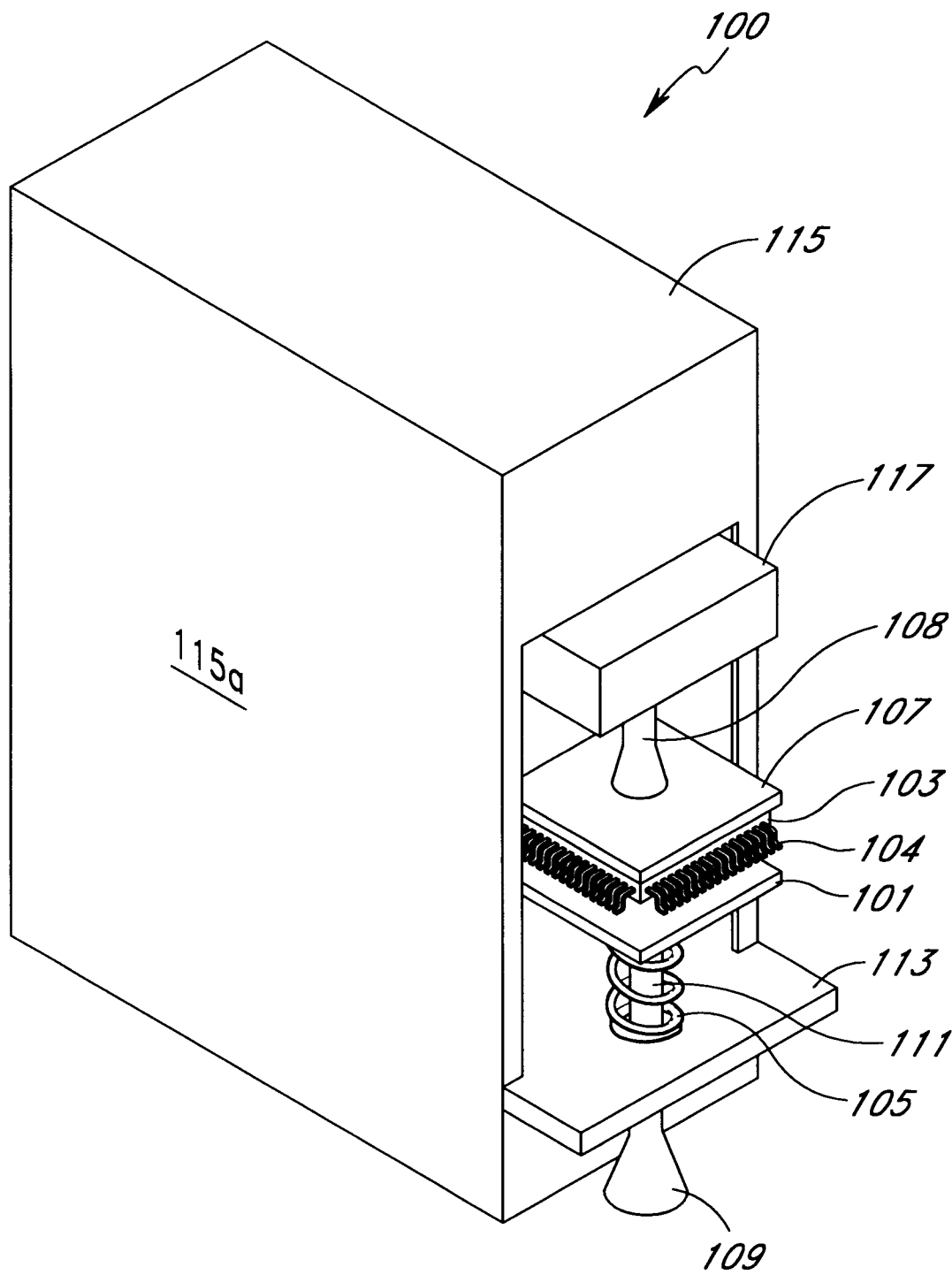
FIG. 2 is a perspective view of a lead configuring apparatus in accordance with one embodiment of the invention.

Referring to FIG. 2, a perspective view of one embodiment of an apparatus 100 for repairing and/or bending the leads of fine pitched components, is illustrated. The apparatus includes a platform 101 for receiving a fine pitched component 103 thereon. The platform 101 has a biasing spring 105 which exerts an upward force on the platform such that the component is pressed between the platform 101 and a top securing member 107 which holds and secures the component 103 between the platform 101 and the top securing member 107. The platform 101 has a form fitting cavity (not shown) designed for receiving the bottom portion of the body of the component 103. The top securing member 107 also has a form-fitting cavity (not shown) therein for receiving the top portion of the component 103. The top securing member 107 and the platform 101 thereby cooperate so as to prevent the component from sliding, or otherwise moving, during a lead bending operation, which is described in further detail below.

A knob 109 is connected to one end of an access rod 111. The other end of the axis rod 111 is connected to the platform 101. As shown in FIG. 2, the axis rod 111 passes through a hole (not shown) of a support table 113 which is coupled to a housing structure 115. The biasing spring 105 is coiled around the access rod 111 and has one end that presses upwardly on the platform 101 and another end that presses downwardly on a top surface of the support table 113. The biasing spring 105 thereby provides a biasing tension which forces the platform 101 upwardly so as to compress a component between the top securing member 107 and the platform 101, when the knob 109 is released. The component 103 is inserted into the cavity of the platform 101 by pulling the knob 109 downwardly so as to provide clearance for the component 103 to be placed into the cavity.

The top securing member 107 is coupled to a rotation motor 117 which rotates the top securing member 107 after the leads 104 on one side of the component 103 have been bent into a desired configuration. In one embodiment, the rotation motor 117 rotates the component 90° so that a second set of leads, extending from a second side surface of the component 103 may be formed in accordance with the invention. As can be appreciated, when the rotation motor 117 rotates the top securing member 107, the component 103, which is positioned within a form-fitting cavity of the top securing member will also be caused to rotate as a result of the rotation of the top securing member 107. Since the bottom portion of the component body is positioned within a form-fitting cavity of the platform 101, as the component 103 is caused to rotate, the platform 101 will rotate as well.

Figure 3:
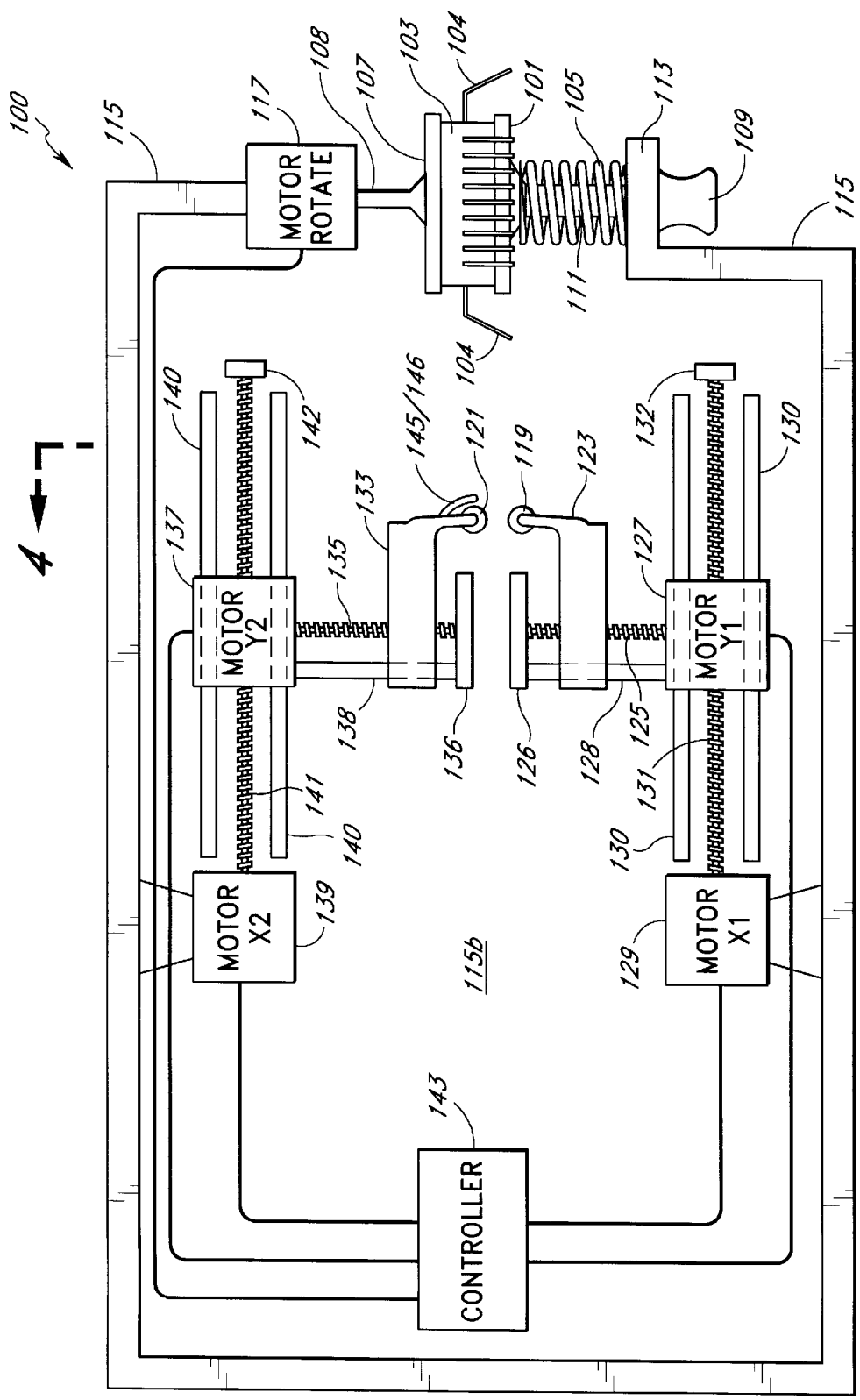
FIG. 3 is a side elevational view of the lead configuring apparatus of FIG. 2 which illustrates the internal mechanics of the apparatus in accordance with one embodiment of the invention.

FIG. 3 illustrates a side elevational view of the apparatus 100 of FIG. 2 with a side wall 115a (FIG. 2) of the housing 115 removed so as to show the internal mechanics of the apparatus 100. As shown in FIG. 3, leads of the components are formed and/or straightened by means of two horizontal dowels or pins 119 and 121, which engage the leads in order to provide bending forces and pivot points about which the leads are bent. The operation of these two dowels 119 and 121, as they engage the leads 104 of the component 103 in order to form the leads into a desired configuration, will be described in greater detail below with references to FIGS. 6A–6F.

The first dowel 119 is rotatably connected to a first arm 123 which is in turn coupled to a first vertical drive shaft 125. The rotatable connection between the first dowel 119 and the first arm 123 is discussed in greater detail below with respect to FIG. 5. The first vertical drive shaft 125 is coupled to a first vertical motor 127 which controls the vertical, or y-direction, motion of the first arm 123 as explained in further detail below. A first horizontal motor 129 is in turn coupled to the first vertical motor 127 by means of a first horizontal drive shaft 131 which controls the horizontal, or x-direction, position of the first vertical motor 127, thereby also controlling the x-direction position of the first arm 123 as explained in further detail below.

In one embodiment, the first vertical drive shaft 125 is a threaded drive screw which extends through and is threadably received by an internally threaded through-hole (not shown) located on the first arm 123. The first vertical motor 127 can rotate the first vertical drive shaft 125 in either a clockwise or counterclockwise direction. When the first vertical drive shaft 125 is caused to rotate clockwise, the external threads of the first vertical drive shaft 125 engage the internal threads of the through-hole located on the first arm 123 so as to cause the first arm 123 to be driven downwardly. Similarly, when the first vertical drive shaft 125 is caused to rotate counter-clockwise, the first arm 123 is driven upwardly. The first vertical drive shaft 125 therefore functions as a drive screw which rotates to drive the first arm 123 either upwardly or downwardly. As anyone who has opened a lid of jar can attest to, the principles of providing upward or downward driving forces by means of spiral threads is well-known in the art.

A first vertical motion stop 126 is attached to the end of the first vertical drive shaft 125, opposite the end that is coupled to the first vertical motor 127, and prevents the first arm 123 from moving past the end of the first vertical drive shaft 125. The motion stop 126 may be a block or other structure having dimensions larger than the dimensions of the through-hole of the first arm 123 such that the motion stop 126 cannot pass through the through-hole, thereby preventing motion of the first arm 123 past the motion stop 126. In one embodiment, the first vertical drive shaft 125 is rotatably coupled to the first vertical motion stop 126 so that the drive shaft 125 may freely rotate without rotating the first vertical motion stop 126. Furthermore, in one embodiment, the first vertical motion stop 126 includes a bearing assembly for rotatably receiving the first vertical drive shaft 125. The bearing assembly may be similar to those found in roller skate or skateboard wheels, which are well-known in the art. The first vertical motor 127 may be a turbine motor or any other type of motor capable of providing a spinning motion which is well-known in the art.

As shown in FIG. 3, a first alignment rod 128 extends upwardly from the first vertical motor 127, through a hole (not shown) of the first arm 123, and connects with the first vertical motion stop 126. As explained in further detail below with respect to FIG. 4, the first alignment rod 128 prevents the first arm 123 from rotating when the first vertical drive shaft 125 rotates.

The first vertical motor 127 is coupled to the first horizontal motor 129 by means of the first horizontal drive shaft 131 and controls the x-direction position of the first vertical motor 127, thereby controlling the x-direction position of the first arm 123, which is coupled to the first vertical motor 127 by means of the first vertical drive shaft 125.

In one embodiment, the first horizontal drive shaft 131 is externally threaded in a spiral configuration and extends through and is threadably received by an internally threaded through-hole located on a housing which contains the first vertical motor 127. The first horizontal motor 129 rotates the first horizontal drive shaft 131 in either a clockwise or counter-clockwise direction. When the first horizontal drive shaft 131 is caused to rotate clockwise, the external threads of the first horizontal drive shaft 131 engage the internal threads of the through-hole located on the housing of the first vertical motor 127 so as to cause the first vertical motor 127 to be driven to the left in the negative x-direction, as shown in FIG. 3. Similarly, when the first horizontal drive shaft 131 is caused to rotate counter-clockwise, the first vertical motor 127 is driven to the right in the positive x-direction, as shown in FIG. 3. The first horizontal drive shaft 131 therefore functions as a drive screw which rotates to drive the first vertical motor 127 either to the left or to the right, as shown in FIG. 3. As mentioned above, the principles of providing driving forces by means of spiral threads is well-known in the art. The first horizontal motor 129 may be a turbine motor or any other type of motor capable of providing a spinning motion which is well-known in the art.

A first horizontal motion stop 132 is attached to the end of the first horizontal drive shaft 131, opposite the end that is coupled to the first horizontal motor 129, and prevents the first vertical motor 127 from moving past the end of the first horizontal drive shaft 131. The motion stop 132 may be a block or other structure having dimensions larger than the dimensions of the through-hole on the housing of the first vertical motor 127 such that the motion stop 132 cannot pass through the through-hole, thereby preventing the first vertical motor 127 from moving past the motion stop 132.

Two slide bearings 130 are coupled to a far side wall 115b of the housing 115 in a parallel fashion with respect to the first horizontal drive shaft 131. As explained in further detail below with respect to FIG. 4, the two slide bearings 130 allow the first vertical motor 127 to move in the horizontal direction while preventing it from rotating as a result of the torque produced by the rotation of the first horizontal drive shaft 131.

The operation of the first vertical motor 127 in conjunction with the operation of the first horizontal motor 129 provides "angular movement" to the first arm 123 in the x-y plane. As used herein, the term "angular motion" refers to motion along a line having a specified slope, or a specified radius of curvature, in the x-y plane. This slope may be infinite (purely vertical), zero (purely horizontal), positive or negative. The first vertical and horizontal motors 127 and 129, respectively, can cooperate to move the first dowel 119 entirely in the x-direction, entirely in the y-direction, or in a direction which is a combination of the x and y directions. By adjusting the rotation speeds of each of the first vertical and horizontal drive shafts 125 and 131, respectively, the first dowel 119 can be caused to move along a line having a specified slope, or a specified radius of curvature, in the x-y plane. The means for controlling the operation of the first vertical and horizontal motors 127 and 129, respectively, and the rotation speeds of their corresponding drive shafts 125 and 131, respectively, are described in further detail below. Therefore, the first dowel 119 may be controlled to engage a plurality of leads in order to repair and/or form the leads in a predefined configuration.

Referring again to FIG. 3, the second dowel 121 is rotatably connected to a second arm 133 which is in turn coupled to a second vertical drive shaft 135. The rotatable connection between the second dowel 121 and the second arm 133 is discussed in greater detail below with respect to FIG. 5. The second vertical drive shaft 135 is coupled to a second vertical motor 137 which controls the vertical, or y-direction, motion of the first arm 123 as explained in further detail below. A second horizontal motor 139 is in turn coupled to the second vertical motor 137 by means of a second horizontal drive shaft 141 which controls the horizontal, or x-direction, position of the second vertical motor 137, thereby also controlling the x-direction position of the second arm 133 as explained in further detail below.

In one embodiment, the second vertical drive shaft 135 is a threaded drive screw which extends through and is thread-ably received by an internally threaded through-hole (not shown) located on the second arm 133. The second vertical motor 137 can rotate the second vertical drive shaft 135 in either a clockwise or counterclockwise direction.

When the second vertical drive shaft 135 is caused to rotate clockwise, the external threads of the second vertical drive shaft 135 engage the internal threads of the through-hole located on the second arm 133 so as to cause the second arm 133 to be driven downwardly. Similarly, when the second vertical drive shaft 135 is caused to rotate counter-clockwise, the second arm 133 is driven upwardly. The second vertical drive shaft 135 therefore functions as a drive screw which rotates to drive the second arm 133 either upwardly or downwardly.

A second vertical motion stop 136 is attached to the end of the second vertical drive shaft 135, opposite the end that is coupled to the second vertical motor 137, and prevents the second arm 133 from moving past the end of the second vertical drive shaft 135. The motion stop 136 may be a block or other structure having dimensions larger than the dimensions of the through-hole on the second arm 133 such that the motion stop 136 cannot pass through the through-hole, thereby preventing motion of the second arm 133 past the motion stop 136. In one embodiment, the second vertical drive shaft 135 is rotatably coupled to the second vertical motion stop 136 so that the drive shaft 135 may freely rotate without rotating the second vertical motion stop 136. The motion stop 136 includes a bearing assembly which rotatably receives the second vertical drive shaft 135. The bearing assembly may be similar to those found in roller skate, or skateboard wheels, which are well-known in the art. The second vertical motor 137 may be a turbine motor or any other type of motor capable of providing a spinning motion which is well-known in the art.

A second alignment rod 128 extends downwardly from the second vertical motor 137, through a portion of the second arm 133, and connects with the second vertical motion stop 136. As explained in further detail below with respect to FIG. 9, the second alignment rod 138 prevents the second arm 133 from rotating when the second vertical drive shaft 135 rotates.

The second vertical motor 137 is coupled to the second horizontal motor 139 by means of the second horizontal drive shaft 141 and controls the x-direction position of the second vertical motor 137, thereby controlling the x-direction position of the second arm 133, which is coupled to the second vertical motor 137 by means of the second vertical drive shaft 135.

In one embodiment, the second horizontal drive shaft 141 is an externally threaded drive screw which extends through and is threadably received by an internally threaded through-hole located on a housing which contains the second vertical motor 137. The second horizontal motor 139 rotates the second horizontal drive shaft 141 in either a clockwise or counter-clockwise direction. When the second horizontal drive shaft 141 is caused to rotate clockwise, the external threads of the second horizontal drive shaft 141 engage the internal threads of the through-hole located on the housing of the second vertical motor 137 so as to cause the second vertical motor 137 to be driven to the left in the negative x-direction, as shown in FIG. 3. Similarly, when the second horizontal drive shaft 141 is caused to rotate counter-clockwise, the second vertical motor 137 is driven to the right in the positive x-direction, as shown in FIG. 3. The second horizontal drive shaft 141 therefore functions as a drive screw which rotates to drive the second vertical motor 137 either to the left or to the right, as shown in FIG. 3. As mentioned above, the principles of providing driving forces by means of spiral threads is well-known in the art. The second horizontal motor 139 may be a turbine motor or any other type of motor capable of providing a spinning motion which is well-known in the art.

A second horizontal motion stop 142 is attached to the end of the second horizontal drive shaft 141, opposite the end that is coupled to the second horizontal motor 139, and prevents the second vertical motor 137 from moving past the end of the second horizontal drive shaft 141. The motion stop 142 may be a block or other structure having dimensions larger than the dimensions of the through-hole on the housing of the second vertical motor 137 such that the motion stop 142 cannot pass through the through-hole, thereby preventing the second vertical motor 137 from moving past the motion stop 142.

A second set of slide bearings 140 are coupled to the far side wall 115*b* of the housing 115 in a parallel fashion with respect to the second horizontal drive shaft 141. As explained in further detail below with respect to FIG. 4, the second set of slide bearings 140 allows the second vertical motor 137 to move in the horizontal direction while preventing it from rotating as a result of the torque produced by the rotation of the second horizontal drive shaft 141.

As described above, the operation of the second vertical motor 137 in conjunction with the operation of the second horizontal motor 139 can provide "angular motion" to the second arm 133 in the x-y plane. The second vertical and horizontal motors 137 and 139, respectively, can cooperate to move the second dowel 121, entirely in the x-direction, entirely in the y-direction, or in a direction which is a combination of the x and y directions. By adjusting the rotation speeds of each of the second vertical and horizontal drive shafts 135 and 141, respectively, the second dowel 121 can be caused to move along a line having a specified slope, or radius of curvature, in the x-y plane. The means for controlling the second vertical and horizontal motors 137 and 139, respectively, and the rotation speeds of their corresponding drive shafts 135 and 141, respectively, are described in further detail below. Therefore, the second dowel 121 may be controlled to engage a plurality of leads in order to repair and/or form the leads in a predefined configuration.

Although the embodiments described above incorporate threaded drive screws and motors which rotate the drive screws in order to provide the driving forces which move the first and second dowels 119 and 121, respectively, other methods and apparatus are contemplated within the scope of the invention. For example, in another embodiment, these drive shafts and their corresponding motors can operate under the principles of hydraulics which are well-known in the art.

As shown in FIG. 3, the apparatus 100 also includes a controller 143 which is electronically coupled to the first and second horizontal motors 129 and 139, respectively, and the first and second vertical motors 127 and 137, respectively, for controlling the operation of these motors. The controller 143 may also control the rotation speeds of each respective drive shaft, 125, 131, 135 and 141, so as to provide predefined angular motion to the first and second dowels 119 and 121, respectively, as described above. In one embodiment, the controller 143 is a programmable logic controller which may be programmed to move the first and second dowels, 119 and 121, respectively, such that they engage the leads of the component 103 in order to form the leads in a desired configuration. Alternatively, the controller 143 may be a computer which executes a software program that controls the motors 127, 129, 137 and 139 so as to move the first and second dowels 119 and 121, in a desired fashion. In another embodiment, the controller 143 is also coupled to the rotation motor 117 in order to control its operation.

Referring again to FIG. 3, a sickle 146 is shown attached to the second arm 133 above the second dowel 121. The sickle 146 is one of a plurality of sickles 146 of a lead straightening/alignment comb 145. The plurality of sickles 146 of the lead straightening/alignment comb 145 move through spaces between adjacent leads of the plurality of leads so as to engage any leads that are skewed or improperly aligned with respect to adjacent leads. The comb 145 having the plurality of sickles 146 essentially "combs" through the plurality of leads in order to straighten any leads that are out of alignment with respect to adjacent leads. The operation of the comb 145 and its corresponding plurality of sickles 146 will be described in further detail below with reference to FIG. 4.

Figure 4:
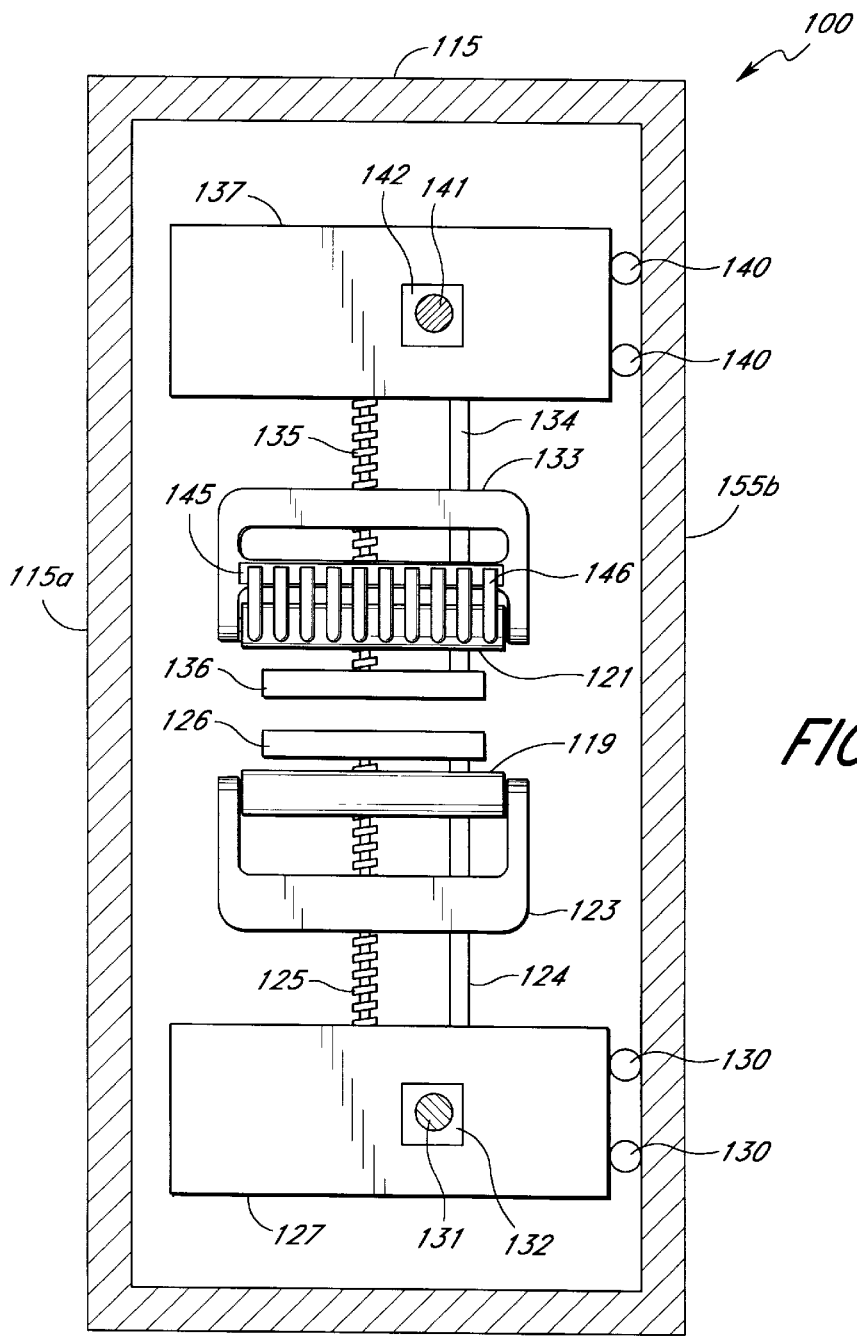
FIG. 4 is a cross-sectional, front elevational view of the lead bending apparatus of FIG. 3, taken along lines 4—4 of that figure.

FIG. 4 shows a cross-sectional front view, taken along lines 4—4 of FIG. 3, of the apparatus 100. Coupled to the second arm is the alignment comb 145 having a plurality of sickles 146, or "teeth", for combing through a plurality of leads of the component (not shown), so as to straighten any misaligned leads. Each sickle 146 corresponds to a space between two adjacent leads and moves through its corresponding space. If a lead is out of alignment, the corresponding sickle 146 will engage the lead and bend the lead toward its proper alignment as it moves through the space, or channel, between two adjacent leads. In one embodiment, the sickles 146 have a curved claw-like configuration. However, these sickles 146 may be replaced by cylindrical pins or other types of members or structures which can fit between the spacings between adjacent leads in order to accomplish the alignment operation in accordance with the invention.

Figure 1:
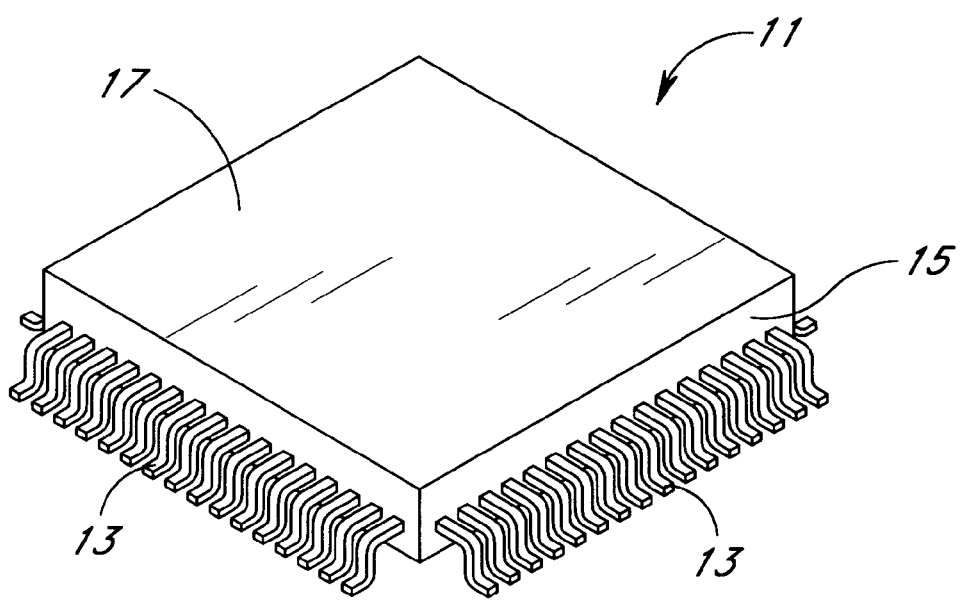
FIG. 1 is a perspective view of a typical fine pitch integrated circuit (IC).

Since the number of leads varies with the type of component that is being repaired, as well as the spacings between the leads, the comb 145 is interchangeable with other combs in order to accommodate different types of lead configurations and spacings. Similarly, depending on the size of the leads and the size of the components, the first and second dowels, 119 and 121, are also interchangeable with other dowels of different sizes in order to achieve different bend angles, or radii of curvature, for bending the leads. In order to accommodate different component sizes, the bottom platform 101 (FIG. 1) and the top securing member 107 (FIG. 1) which holds the component 103 (FIG. 1) in place during the bending of the leads 104 are also interchangeable.

As shown in FIG. 4, the first alignment rod 124 extends upwardly from the housing of the first vertical motor 127, passes through a hole (not shown) in the first arm 123 and attaches to the first vertical motion stop 126. By providing mechanical lubrication such as oil, or other well known lubricant, to the first alignment rod 124 and/or the hole within the first arm 123, through which the first alignment rod 124 passes, the first arm 123 may be made to easily slide up and down the alignment rod 124 without undue friction. It will be appreciated that the alignment rod 124 prevents the first arm 123 from rotating, with respect to the first vertical motor 127, as the first vertical drive shaft 125 rotates to provide vertical motion to the first arm 123. As explained below, the first slide bearings 130 prevent the first vertical motor 127 from rotating as the result of the torque produced when the first vertical drive shaft 125 rotates.

The first set of slide bearings 130 is attached to the side wall 115*b* of the housing 115, so as to extend in a direction parallel to the first horizontal drive shaft 131 and so as to engage a side surface of the housing of the first vertical motor 127. As the first vertical motor 127 is moved horizontally by the rotation of the first horizontal drive shaft 131, the first vertical motor 127 slides against the first slide bearings 130. Therefore, the first slide bearings 130 function as guide rails for the first vertical motor 127 and prevent the first vertical motor 127 from rotating as a result of the rotation of the first horizontal drive shaft 131. Furthermore, the first slide bearings 130 also prevent a transverse rotation which may otherwise occur as a result of the torque produced by the rotation of the first vertical drive shaft 125. The slide bearings 130 may be any type of linear slide apparatus, which is well-known in the art, such as multiple ball bearings, or rollers, contained within a linear track, for example.

The second alignment rod 134 extends downwardly from the housing of the second vertical motor 137, passes through a hole (not shown) in the second arm 133 and attaches to the second vertical stop 136. By providing mechanical lubrication, such as oil or other well known lubricant, to the second alignment rod 134 and/or the hole within the second arm 133, the second arm 133 may be made to easily slide up and down the alignment rod 134 without undue friction. It will be appreciated that the alignment rod 134 prevents the second arm 133 from rotating, with respect to the second vertical motor 137, as the result of the rotation of the second vertical drive shaft 135. As explained below, the second set of slide bearings 140 prevent the second vertical motor 137 from rotating as the result of torque produced when the second vertical drive shaft 135 rotates.

The second set of slide bearings 140 is attached to the side wall 115b of the housing 115, so as to extend in a direction parallel to the second horizontal drive shaft 141 and so as to engage a side surface of the housing of the second vertical motor 137. As the second vertical motor 137 is moved horizontally by the rotation of the second horizontal drive shaft 141, the second vertical motor 137 slides, or glides, along the slide bearings 140. Therefore, the second slide bearings 140 function as guide rails for the second vertical motor 137 and prevent the second vertical motor 137 from rotating as a result of the rotation of the second horizontal drive shaft 141. Furthermore, the second slide bearings 140 also prevent a transverse rotation which may otherwise occur as a result of the torque produced by the rotation of the second vertical drive shaft 135. The slide bearings 140 may be any type of linear slide apparatus which is well-known in the art, such as multiple ball bearings, or rollers, contained within a linear track, for example.

Figure 5:
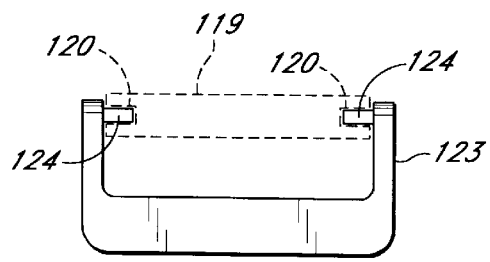
FIG. 5 is a side elevational view of a dowel which is rotatably coupled to a first arm of the lead configuring apparatus in accordance with one embodiment of the invention.

Referring to FIG. 5, one embodiment of the first dowel 119 coupled to the first arm 123 is shown. Dashed lines represent the first dowel 119 which is rotatably coupled to the first arm 123 via nipples 124. The nipples 124 are attached to the first arm 123 and extend inwardly toward the first dowel 119 along a longitudinal axis of the first dowel 119. As shown in FIG. 5, the first dowel 119 is cylindrical in shape with a groove, or cavity 120, located at each end of the cylinder and extending into the cylinder along its longitudinal axis. The nipples 124 extend into and are positioned within the respective grooves 120 and thereby support the first dowel 119 on the first arm 123. In one embodiment, the nipples 124 and/or the grooves 120 may be mechanically lubricated so as to allow the first dowel 119 to easily rotate around the nipples 124 which serve as an axis of rotation. In another embodiment, each end of the first dowel 119 may be coupled to the first arm 123 by means of a rotatable bearing housing (not shown) located in each groove 120. The bearing assembly may be similar to those found in roller skate or skateboard wheels. However, any other method of rotatably coupling the first dowel 119 to the first arm 123 may be used in accordance with the invention.

FIGS. 6A–6F illustrate one embodiment of the operation of the first and second dowels, 119 and 121, respectively, and the comb 145 as they cooperate to engage and form the leads 104 of a component 103. Although FIGS. 6A–6F illustrate only one sickle or finger 146, of the comb 145 and only one lead 104 of the component 103, it should be understood that the first and second dowels, 119 and 121, may engage a plurality of leads 104 simultaneously so as to simultaneously form the leads as described below. Similarly, the comb 145 may have a plurality of sickles 146 for aligning the plurality of leads 104.

FIG. 6A shows the first dowel 119 positioned along a bottom surface of a lead 104 at a first position 201 where the lead is to be bent. The second dowel 121 is positioned above the first dowel along a top surface of the lead 104. A sickle 146 of the alignment comb 145 (FIG. 10) is positioned within a corresponding space between adjacent leads. As shown in FIG. 6B, in order to provide a first bend at the first position 201 of the lead 104, the second dowel 121 begins moving toward the left and downwardly, thereby exerting a downward force on the top surface of the lead 104. As shown in FIG. 6C, as the second dowel 121 begins moving downwardly and toward the left of its initial position, it presses the top surface of the lead 104 downwardly in order to force the lead 104 to bend around the first dowel 119 at the first position 201 of the lead 104. As can also be seen from FIG. 6C, as the second dowel 121 begins moving downwardly, the sickle 146 of the comb 145 moves along the space behind the lead 104 and in between the lead 104 and an adjacent lead (not shown). In this way, each sickle 146 of the comb 145 "combs" through the spacings between adjacent leads of the plurality of leads of the component, thereby engaging any skewed or misaligned leads so as to properly align adjacent leads with respect to each other.

After the first bend at the first position 201 of the lead 104 is formed, the second dowel 121 comes to rest at a second position 203 of the lead 104 where another bend is to be formed. As shown in FIG. 6D, the first dowel 119 begins to move downwardly and toward the left from its initial position thereby exerting an upward force on a bottom surface of the lead 104 so as to bend the lead 104 at this second position 203. FIG. 6E shows the first dowel 119 positioned below the second dowel 121 as it forces the lead 104 upwardly to bend around the second dowel 121, thereby forming the second bend at the second position 203 of the lead 104. As shown in FIG. 6F, after the second bend is formed both the first and second dowels, 119 and 121, respectively, as well as the comb 145 move toward the left and away from the lead 104 of the component. At this stage, each lead of the plurality of leads should be properly configured and in alignment with respect to each other, in accordance with the invention.

Figure 7:
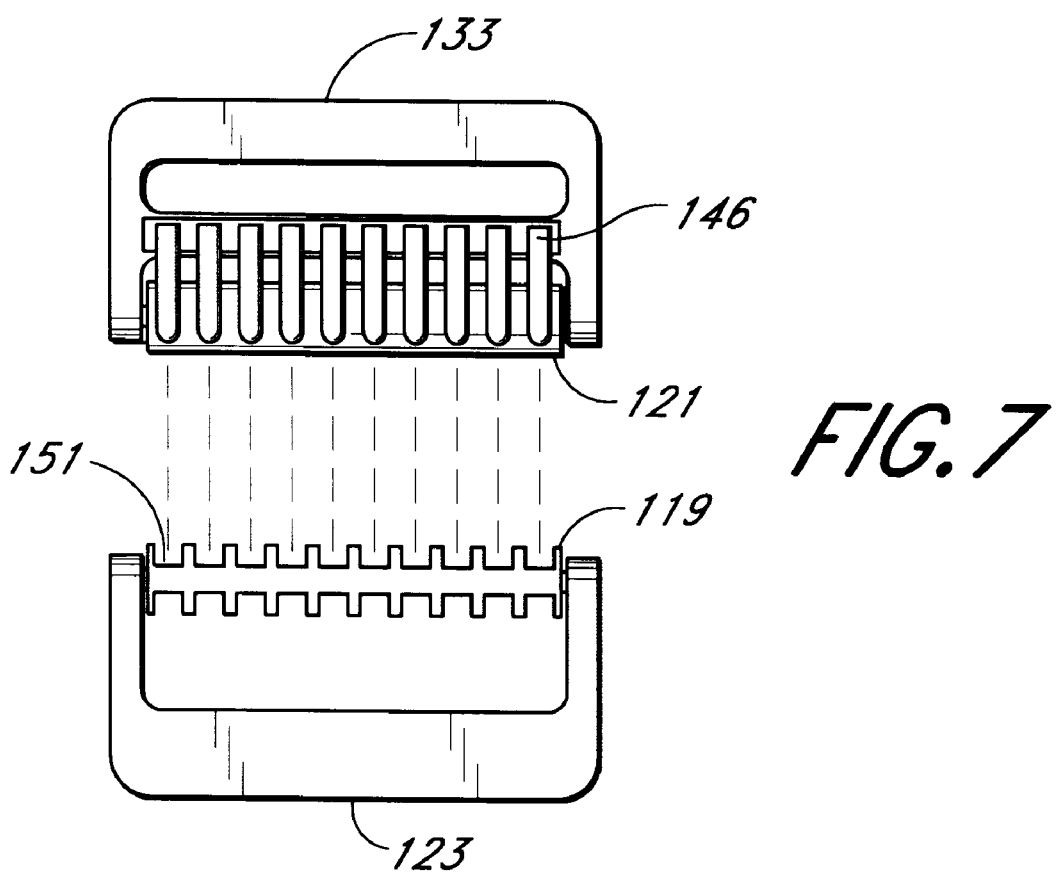
FIG. 7 is a side elevational view of a dowel having channels cut therein for providing clearance for sickles of an alignment comb, in accordance with one embodiment of the invention.

Referring to FIG. 7, one embodiment of the first dowel 119 is illustrated. As shown, the first dowel 119 includes a plurality of grooves or channels 151. The purpose of the channels 151 is to provide clearance for corresponding sickles 146 (FIG. 5) during the lead bending/repairing process described above with respect to FIGS. 6A–6F. Alternatively, the sickles 146 may be spring-biased so as to "give way" as they are engaged by the first dowel 119 during a lead bending/repairing process. As a third option, a combination of forming channels 151 in the first dowel 119 and spring-biasing the sickles 146 may be implemented in accordance with the invention.

Thus, the invention provides a method and apparatus for efficiently and accurately repairing and/or bending (also refereed to herein as "configuring") the leads of components. The invention, therefore, eliminates much time wasted during prior art methods of manually configuring the leads of a component which is to be placed on a printed circuit board. Typically, such printed circuit boards have preconfigured contact pads for making electrical contact with corresponding leads of the component. Therefore, the leads of the component must be properly configured to make contact with corresponding contact pads of the printed circuit board. Additionally, by providing an automated method and apparatus for reforming the damaged leads of a component, the invention provides an efficient and accurate method of salvaging damaged components and reduces or eliminates much of the time and resources associated with repairing damaged leads manually, using tweezers or some other tool. Additionally, not only is the cost of the component saved but the amount of time wasted while waiting for new parts to arrive is eliminated.

The invention may be embodied in other specific forms without departing from its spirit or essential characteristic. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. An apparatus for configuring a plurality of leads of a component, comprising:
    a securing structure which receives and holds the component;
    a first member which engages the plurality of leads of the component; and
    a second member which engages the plurality of leads of the component, wherein the first and second members each move with respect to the leads so as to bend;
    a first portion of each of the plurality of leads about a portion of the first member and to substantially bend a second portion of each of leads about a portion of the second member, to thereby form the plurality of leads into a desired shape.

2. The apparatus of claim 1 wherein said securing structure comprises:
    a bottom platform having a cavity located at a top surface of the platform; and
    a top securing member having a cavity located at a bottom surface thereof, wherein, the component is positioned within the cavities of the bottom platform and the top securing member such that the component is held and secured between the bottom platform and the top securing member.

3. The apparatus of claim 2 further comprising a biasing spring, coupled to a bottom surface of the bottom platform, wherein, during bending of the plurality of leads, the biasing spring exerts an upward force on the platform such that the component is held and secured between the bottom platform and the top securing member.

4. The apparatus of claim 1 wherein said first and second members are each configured in the shape of cylindrical dowels.

5. The apparatus of claim 1 further comprising a plurality of alignment members for engaging the plurality of leads and for configuring said leads in a desired orientation with respect to one another.

6. The apparatus of claim 1 further comprising:
    a first moveable arm, coupled to the first member; and
    a second moveable arm, coupled to the second member, wherein the first and second moveable arms move in cooperation with each other so as to move the first and second members, respectively, such that the first and second members engage the plurality of leads to form the leads into desired configurations.

7. The apparatus of claim 6 further comprising:
    a first horizontal motor, coupled to the first arm, for moving the first arm in a x-direction;
    a first vertical motor, coupled to the first arm, for moving the first arm in a y-direction, wherein the first horizontal and vertical motors cooperate with one another to provide angular motion to the first arm;
    a second horizontal motor, coupled to the second arm, for moving the second arm in the x-direction; and
    a second vertical motor, coupled to the second arm, for moving the second arm in the y-direction, wherein the second horizontal and vertical motors cooperate with one another to provide angular motion to the second arm.

8. The apparatus of claim 7 further comprising a controller, coupled to the first horizontal and vertical motors and the second horizontal and vertical motors, for controlling the operation of the motors so as to provide synchronized motion to the first and second arms such that the first and second members engage the plurality of leads to form the leads into the desired shape.

9. The apparatus of claim 7 further comprising a motor for rotating the component so as to position a second plurality of leads of the component such that the first and second members may engage the second plurality of leads to form them into a desired configuration.

10. A system for configuring a plurality of leads of a component, comprising:
    a securing structure which receives and holds the component;
    a first arm;
    a first member, coupled to the first arm, for engaging the plurality of leads of the component;
    a first vertical motor, coupled to the first arm, for moving the first arm vertically, in a y-direction;
    a first horizontal motor, coupled to the first vertical motor, for moving the vertical motor and the first arm horizontally, in a x-direction, wherein the first horizontal and vertical motors cooperate so as to provide angular movement to the first arm;
    a second arm;
    a second member, coupled to the second arm, for engaging the plurality of leads of the component;
    a second vertical motor, coupled to the second arm, for moving the second arm vertically, in a y-direction;
    a second horizontal motor, coupled to the second vertical motor, for moving the second vertical motor and the second arm horizontally, in a x-direction, wherein the second vertical and horizontal motors cooperate with one another so as to provide angular movement to the second arm; and
    a controller, coupled to the first and second vertical motors and the first and second horizontal motors, for controlling the motion of the first and second arms, wherein the first and second members each move with respect to the leads and mechanically cooperate to engage the plurality of leads so as to bend a first portion of each of the plurality of leads about a portion of the first member and to subsequently bend a second portion of each of the plurality of leads about a portion of the second member, to thereby form the leads into a desired configuration.

11. The apparatus of claim 10 further comprising:

a first horizontal drive shaft, coupled to the first horizontal motor and the first vertical motor, for driving the motion of the first vertical motor in the x-direction;

a first vertical drive shaft, coupled to the first vertical motor and the first arm, for driving the motion of the first arm in the y-direction, wherein the first horizontal and vertical drive shafts cooperate with one another so as to provide angular movement to the first arm;

a second horizontal drive shaft, coupled to the second horizontal motor and the second vertical motor, for driving the motion of the second vertical motor in the x-direction; and a second vertical drive shaft, coupled to the second vertical motor and the second arm, for driving the motion of the second arm in the y-direction, wherein the second horizontal and vertical drive shafts cooperate with one another so as to provide angular movement to the second arm.

12. The apparatus of claim 10 wherein the controller is a programmable logic controller.

13. The apparatus of claim 10 wherein the controller is a computer which executes a program for controlling the first x-direction and y-direction motors and the second x-direction and y-direction motors.

14. A system for configuring a plurality of leads of a component, comprising:

a securing structure which receives and holds the component;

a first arm;

a first member, coupled to the first arm, for engaging the plurality of leads of the component;

a first vertical motor, coupled to the first arm, for moving the first arm vertically, in a y-direction;

a first horizontal motor, coupled to the first vertical motor, for moving the vertical motor and the first arm horizontally, in a x-direction, wherein the first horizontal and vertical motors cooperate so as to provide angular movement to the first arm;

a second arm;

a second member, coupled to the second arm, for engaging the plurality of leads of the component;

a second vertical motor, coupled to the second arm, for moving the second arm vertically, in a y-direction;

a second horizontal motor, coupled to the second vertical motor, for moving the second vertical motor and the second arm horizontally, in a x-direction, wherein the second vertical and horizontal motors cooperate with one another so as to provide angular movement to the second arm;

a controller, coupled to the first and second vertical motors and the first and second horizontal motors, for controlling the motion of the first and second arms, wherein the first and second members mechanically cooperate to engage the plurality of leads so as to bend and form the leads into a desired configuration; and a plurality of alignment members, coupled to the second arm, for engaging the plurality of leads so as to straighten the plurality of leads so that adjacent leads are properly aligned with respect to one another.

15. A system for configuring a plurality of leads of a component, comprising:

a securing structure which receives and holds the component;

a first arm;

a first dowel rotatably attached to the first arm;

a first vertical motor, coupled to the first arm, for moving the first arm vertically, in a y-direction;

a first horizontal motor, coupled to the first vertical motor, for moving the vertical motor and the first arm horizontally, in a x-direction, wherein the first horizontal and vertical motors cooperate so as to provide angular movement to the first arm;

a second arm;

a second dowel rotatably attached to the second arm;

a second member, coupled to the second arm, for engaging the plurality of leads of the component;

a second vertical motor, coupled to the second arm, for moving the second arm vertically, in a y-direction;

a second horizontal motor, coupled to the second vertical motor, for moving the second vertical motor and the second arm horizontally, in a x-direction, wherein the second vertical and horizontal motors cooperate with one another so as to provide angular movement to the second arm; and a controller, coupled to the first and second vertical motors and the first and second horizontal motors, for controlling the motion of the first and second arms, wherein the first and second members mechanically cooperate to engage the plurality of leads so as to bend and form the leads into a desired configuration.

16. The system of claim 15 further comprising a rotation motor, coupled to the controller, for rotating the component so as to position a second plurality of leads of the component such that the first and second dowels engage the second plurality of leads to form them into a desired shape.

17. A system for configuring a plurality of leads of a component, comprising:

means for securing the component so as to prevent the component from moving;

means for positioning a first member under the plurality of leads at a first bottom position;

means for positioning a second member above the plurality of leads at a first top position;

means for moving the second member so as to engage a top surface of each lead, thereby exerting a downward force on the plurality of leads, wherein the plurality of leads are caused to bend around a portion of the first member located at the first bottom position; and means for moving the first member so as to engage a bottom surface of each lead, thereby exerting an upward force on the plurality of leads, wherein the plurality of leads are caused to bend around a portion of the second member located at a second top position.

18. The system of claim 17 further comprising means for straightening the plurality of leads so as to properly align adjacent leads with respect to one another.

19. The system of claim 17 further comprising:

means for rotating the component so as to position a second plurality of leads of the component such that the first and second members may engage the second plurality of leads to form them into a desired shape.

20. The system of claim 17 further comprising:
means for rotating the first member along the bottom surface of each lead as the first member exerts an upward force on the plurality of leads; and
means for rotating the second member along the top surface of each lead as the second member exerts a downward force on the plurality of leads.

21. A method of configuring a plurality of leads of a component, comprising:
securing the component so as to prevent the component from moving;
positioning a first member under the plurality of leads at a first bottom position;
positioning a second member above the plurality of leads at a first top position;
moving the second member so as to engage a top surface of each lead, thereby exerting a downward force on the plurality of leads, wherein the plurality of leads are caused to bend around a portion of the first member located at the first bottom position; and
moving the first member so as to engage a bottom surface of each lead, thereby exerting an upward force on the plurality of leads and forcing the plurality of leads to bend around a portion of the second member located at a second top position.

22. The method of claim 21 further comprising moving a plurality of alignment members within spaces between adjacent leads of the plurality of leads so as to straighten and align each lead of the plurality of leads with respect to adjacent leads.

23. The method of claim 21 further comprising rotating the component so as to position a second plurality of leads of the component such that the first and second members may engage the second plurality of leads to form them into a desired configuration.

24. A method of configuring a plurality of leads of a component, comprising:
securing the component to a platform so as to prevent the component from moving;
positioning a first dowel under the plurality of leads at a first bottom position;
positioning a second dowel above the plurality of leads at a first top position;
moving the second dowel so as to engage a top surface of each lead, thereby exerting a downward force on the plurality of leads, wherein the plurality of leads are caused to bend around the first dowel located at the first bottom position, and wherein the motion of the second dowel is ceased when the second dowel reaches a second top position; and
moving the first dowel so as to engage a bottom surface of each lead, thereby exerting an upward force on the plurality of leads, wherein the plurality of leads are caused to bend around the second dowel located at the second top position.

25. The method of claim 24 further comprising moving a plurality of alignment members within corresponding spaces between adjacent leads of the plurality of leads so as to align each lead of the plurality of leads with respect to adjacent leads.

26. The method of claim 24 further comprising rotating the component so as to position a second plurality of leads of the component to be formed by the first and second dowels, wherein the first and second dowels engage the second plurality of leads to form them into a desired configuration.

27. The method of claim 24 wherein:
the act of moving the first dowel includes rotating the first dowel along the bottom surface of each lead as the first dowel exerts an upward force on the plurality of leads; and
the act of moving the second dowel includes rotating the second dowel along the top surface of each lead as the second dowel exerts a downward force on the plurality of leads.

28. A method of configuring at least one lead of a component, comprising:
securing the component to a platform so as to prevent the component from moving;
positioning a first member under the plurality of leads at a first bottom position;
positioning a second member above the plurality of leads at a first top position;
moving the second member so as to engage a top surface of each lead, thereby exerting a downward force on the plurality of leads, wherein the plurality of leads are caused to bend around the first member located at the first bottom position;
moving the first member so as to engage a bottom surface of each lead, thereby exerting an upward force on the plurality of leads, wherein the plurality of leads are caused to bend around the second member located at a second top position; and
moving a plurality of alignment members within corresponding spaces between adjacent leads of the plurality of leads so as to straighten and align the adjacent leads with respect to each other.

29. The method of claim 28 wherein:
the act of moving the first member includes rotating a first dowel along the bottom surface of each lead as the first dowel exerts an upward force on the plurality of leads; and
the act of moving the second member includes rotating a second dowel along the top surface of each lead as the second dowel exerts a downward force on the plurality of leads.

30. A method of configuring at least one lead of a component, comprising:
controlling a first machine to move a first member to engage the at least one lead of the component in a predefined manner; and
controlling a second machine to move a second member to engage the at least one lead in a predefined manner, wherein the first and second members each move with respect to the at least one lead and cooperate to bend a first portion of the at least one lead about a portion of one of the first and second members and to subsequently bend a second portion of the at least one lead about a portion of one of the first and second members, so as to form the at least one lead in a desired configuration.

31. The method of claim 30 wherein:
the act of moving the first member includes rotating a first dowel along the bottom surface of each lead as the first dowel exerts an upward force on the plurality of leads; and
the act of moving the second member includes rotating a second dowel along the top surface of each lead as the second dowel exerts a downward force on the plurality of leads.

32. The method of claim 30 further comprising the step of securing the component such that it remains stable during the configuring of the at least one lead into a desired configuration.

33. In a system having first vertical and horizontal motors and second vertical and horizontal motors, a method of configuring a plurality of leads of a component, comprising:

controlling the first vertical motor to move a first member in a vertical direction;

controlling the first horizontal motor to move the first member in a horizontal direction, wherein the first vertical and horizontal motors cooperate such that the first member engages the at least one lead of the component in a predefined manner;

controlling the second vertical motor to move a second member in a vertical direction; and controlling the second horizontal motor to move the second member in a horizontal direction, wherein the second vertical and horizontal motors cooperate such that the second member engages the at least one lead of the component in a predefined manner, and wherein the first and second members each move with respect to the at least one lead and cooperate so as to bend a first portion of the at least one lead about a portion of one of the first and second members and to subsequently bend a second portion of the at least one lead about a portion of one of the first and second members, so as to form the at least one lead into a desired configuration.

34. The method of claim 33 further comprising securing the component such that it remains stable while the plurality of leads are configured by the first and second members.

35. The method of claim 34 further comprising controlling the second vertical and horizontal motors to move a plurality of alignment members such that the alignment members engage the plurality of leads so as to align each lead of the plurality of leads with respect to each other.

36. The method of claim 34 further comprising rotating the component so as to position a second plurality of leads of the component to be formed into a desired configuration by the first and second members.

37. A method of configuring a plurality of leads of a component, comprising:

controlling a first vertical motor to rotate a first vertical drive screw in a specified direction and at a specified speed;

controlling a first horizontal motor to rotate a first horizontal drive screw in a specified direction and at a specified speed, wherein the first vertical and horizontal drive screws cooperate to provide angular motion to a first member such that the first member engages the plurality of leads in a predefined manner;

controlling a second vertical motor to rotate a second vertical drive screw in a specified direction and at a specified speed; and controlling a second horizontal motor to rotate a second horizontal drive screw in a specified direction and at a specified speed, wherein the second vertical and horizontal drive screws cooperate to provide angular motion to a second member such that the second member engages the plurality of leads in a predefined manner, and wherein the first and second members each move with respect to the at least one lead and cooperate to bend a first portion of the plurality of leads about a portion of one of the first and second members and to subsequently bend a second portion of the plurality of leads about a portion of one of the first and second members, so as to form the plurality of leads into a desired configuration.

38. The method of claim 37 further comprising securing the component such that it remains stable during the bending of the plurality of leads into a desired configuration.

39. The method of claim 37 further comprising moving a plurality of alignment members within spaces between adjacent leads of the plurality of leads so as to align the adjacent leads with respect to each other.

40. A method of configuring a plurality of leads of a component, comprising:

controlling a first vertical motor to rotate a first vertical drive screw in a specified direction and at a specified speed;

controlling a first horizontal motor to rotate a first horizontal drive screw in a specified direction and at a specified speed, wherein the first vertical and horizontal drive screws cooperate to provide angular motion to a first member such that the first member engages the plurality of leads in a predefined manner;

controlling a second vertical motor to rotate a second vertical drive screw in a specified direction and at a specified speed;

controlling a second horizontal motor to rotate a second horizontal drive screw in a specified direction and at a specified speed, wherein the second vertical and horizontal drive screws cooperate to provide angular motion to a second member such that the second member engages the plurality of leads in a predefined manner, and wherein the first and second members cooperate to bend a first portion of the plurality of leads about a portion of one of the first and second members and to subsequently bend a second portion of the plurality of leads about a portion of one of the first and second members, so as to form the plurality of leads into a desired configuration;

the act of moving the first member includes rotating a first dowel along the bottom surface of each lead as the first dowel exerts an upward force on the plurality of leads; and the act of moving the second member includes rotating a second dowel along the top surface of each lead as the second dowel exerts a downward force on the plurality of leads.

41. A method of configuring a plurality of leads of a component, comprising:

securing the component so as to prevent the component from moving;

positioning a first member under the plurality of leads;

positioning a second member above the plurality of leads;

moving at least one of the first and second members at a first time so as to engage a surface of each lead at a first location, thereby exerting a force on the plurality of leads, wherein the plurality of leads are caused to bend around a portion of the other member so as to form a first bend in the plurality of leads; and moving at least one of the first and second members at a second time so as to engage a surface of each lead at a second location, thereby exerting a force on the plurality of leads, wherein the plurality of leads are caused to bend around a portion of the other member so as to form a second bend in the plurality of leads.

42. The method of claim 41 further comprising rotating the component so as to position a second plurality of leads of the component such that the first and second members may engage the second plurality of leads to form them into a desired configuration.

43. An apparatus for configuring a plurality of leads of a component, comprising:

a securing structure which receives and holds the component;

a first member which engages the plurality of leads of the component; and a second member which engages the plurality of leads of the component, wherein the first and second members each move with respect to the leads and cooperate so as to bend a first portion of the at least one lead about a portion of one of the first and second members and to subsequently bend a second portion of the at least one lead about a portion of one of the first and second members, so as to form the plurality of leads into a desired shape.

44. A method of configuring a plurality of leads of a component, comprising:

positioning a first member in contact with at least one of the plurality of leads at a first location on said at least one lead;

positioning a second member in contact with the at least one lead at a second location on said at least one lead;

moving the first member with respect to the second member so as to bend a first portion of the at least one lead about a portion of the second member; and subsequent to moving the first member, moving the second member with respect to the first member so as to bend a second portion of the at least one lead about a portion of the first member, so as to form the at least one lead into a desired shape.

* * * * *